United States Patent [19]

Tachibana et al.

[11] Patent Number: 5,384,470

[45] Date of Patent: Jan. 24, 1995

[54] HIGH TEMPERATURE RECTIFYING CONTACT INCLUDING POLYCRYSTALLINE DIAMOND AND METHOD FOR MAKING SAME

[75] Inventors: Takeshi Tachibana, Osaka, Japan; Dale G. Thompson, Jr., Chapel Hill; Jeffrey T. Glass, Apex, both of N.C.

[73] Assignee: Kobe Steel, USA, Inc., Research Triangle Park, N.C.

[21] Appl. No.: 970,252

[22] Filed: Nov. 2, 1992

[51] Int. Cl.⁶ ............................ H01L 23/48; H01L 23/52
[52] U.S. Cl. ........................................ 257/77; 257/485; 257/280; 257/764; 257/768
[58] Field of Search .............. 257/77, 486, 280, 764, 257/768, 770, 757, 485

[56] References Cited

U.S. PATENT DOCUMENTS

| | | | |
|---|---|---|---|
| 4,982,243 | 1/1991 | Nakahata et al. | 257/77 |
| 5,087,322 | 2/1992 | Lillienfeld et al. | 257/77 |
| 5,155,559 | 10/1992 | Humphreys et al. | 257/770 |
| 5,294,814 | 3/1994 | Das | 257/77 |

FOREIGN PATENT DOCUMENTS

| | | | |
|---|---|---|---|
| 0417645A1 | 3/1991 | European Pat. Off. | 257/77 |
| 2-223437 | 9/1990 | Japan | 257/77 |
| 4-196489 | 7/1992 | Japan | 257/77 |

OTHER PUBLICATIONS

Geis et al., "High-Temperature Point-Contact Transistors and Schottky Diodes Formed on Synthetic Boron-Doped Diamond", IEEE Electron Device Letters, vol. EDL.-8, No. 8, pp. 341-343, Aug. 1987.

Gildenblat et al., "High Temperature Schottky Diodes with Boron-Doped Homoepitaxial Diamond Base", Mat. Res. Bul., vol. 25, pp. 129-134 (1990).

Shiomi et al., "Characterization of Boron-Doped Diamond Epitaxial Films and Applications for High-Voltage Schottky Diodes and MESFET's ", New Diamond Science and Technology, 1991 MRS Int. Conf. Proc., pp. 975-980.

*Primary Examiner*—steven Ho Yin Loke
*Attorney, Agent, or Firm*—Bell, Seltzer, Park & Gibson

[57] ABSTRACT

A rectifying contact including a refractory metal carbide layer on a polycrystalline diamond layer provides high temperature operation and may be included in semiconductor devices, such as diodes and field effect transistors. The refractory metal carbide layer forms a substantially chemically non-reactive interface with the polycrystalline diamond. A single layer of substantially stoichiometric proportions of the refractory metal layer is provided in one embodiment of the rectifying contact. Another embodiment includes a second metal-rich refractory metal carbide layer on the stoichiometric layer. Yet another embodiment includes a carbon-rich refractory metal layer between the stoichiometric layer and the polycrystalline diamond layer. A metal field effect transistor including the rectifying contact may also be fabricated. A method for making the rectifying contact includes depositing a layer, or layers, of the refractory metal carbide on the polycrystalline diamond, as contrasted with a solid state reaction to form the refractory metal carbide. Another method includes depositing the polycrystalline diamond on a refractory metal carbide layer.

26 Claims, 5 Drawing Sheets

HIGH TEMPERATURE RECTIFYING CONTACT INCLUDING POLYCRYSTALLINE DIAMOND AND METHOD FOR MAKING SAME

FIELD OF THE INVENTION

The invention relates to the field of semiconductor devices, and, more particularly, to a diamond rectifying contact and associated fabrication method for use in semiconductor devices, such as diodes and transistors.

BACKGROUND OF THE INVENTION

Diamond is a preferred material for semiconductor devices because it has semiconductor properties that are better than traditionally used silicon, germanium, or gallium arsenide. Diamond provides a higher energy band gap, a higher breakdown voltage and a greater saturation velocity than these traditional semiconductor materials. These properties of diamond yield a substantial increase in projected cutoff frequency and maximum operating voltage compared to devices fabricated using conventional semiconductor materials. For example, silicon is typically not used at temperatures higher than about 200° C. and gallium arsenide is not typically used above 300° C. These temperature limitations are caused, in part, because of the relatively small energy band gaps for silicon (1.12 eV at ambient temperature) and gallium arsenide (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments. In other words, diamond is also a "radiation-hard" material.

Because of the advantages of diamond as a material for semiconductor devices, there is at present an interest in the growth and use of diamond for high temperature and radiation-hardened electronic devices. Key to many of such devices, such as diodes and field effect transistors (FET's), is a rectifying contact having good rectifying characteristics even at relatively high temperatures. Consequently, the fabrication of rectifying contacts on diamond will play an important role in the development of future diamond-based semiconductor devices.

Rectifying contacts have been successfully obtained on single crystal semiconducting diamond. For example, U.S. Pat. No. 4,982,243 to Nakahata et al. discloses a rectifying contact on a single crystal diamond layer that may be formed by the chemical vapor deposition of refractory metals, such as tungsten, molybdenum, niobium, tantalum, as well as other materials such as aluminum, polycrystalline silicon, nickel, gold, platinum, tungsten carbide, molybdenum carbide, tantalum carbide, niobium carbide, tungsten silicide or molybdenum silicide. Unfortunately, to produce a rectifying contact, a single crystal diamond substrate must be used and a single crystal diamond layer must be homoepitaxially deposited on the substrate. Moreover, the single crystal diamond substrate must have a polished surface which inclines at an angle of not larger than 10° to a (100) plane. Similarly, European patent application No. 417,645 A1 to Shiomi, entitled *MES Field Effect Transistor Formed in a Diamond Layer*, discloses a rectifying gate electrode requiring single crystal diamond. The rectifying gate electrode may be gold, platinum, copper, molybdenum, tungsten, aluminum, nickel cobalt, manganese, or carbides thereof. However, a single crystal diamond substrate is relatively expensive and large substrate sizes are not readily available as desirable for many semiconductor applications.

Geis, in an article entitled *High-Temperature Point-Contact Transistors and Schottky Diodes Formed on Synthetic Boron-Doped Diamond*, IEEE Electron Device Letters, Vol. EDL.-8, No. 8, pp. 341–343, August 1987, discloses a point contact rectifying contact for a transistor on single crystal diamond. Similarly, Shiomi et al. in Characterization of *Boron-Doped Diamond Epitaxial Films and Applications for High-Voltage Schottky Diodes and MESFET's*, New Diamond Science and Technology, 1991 MRS Int. Conf. Proc., pp. 975–980, discloses a titanium rectifying contact formed on a homoepitaxial diamond film deposited on a (100) surface of a synthesized single crystal type Ib diamond substrate.

U.S. Pat. No. 5,155,559 to Humphries et al. entitled *High Temperature Refractory Silicide Rectifying Contact and Method for Making Same*, discloses a rectifying contact on either single crystal or polycrystalline diamond. The contact includes a layer of refractory metal silicide. Moreover, a non-abrupt interface region is formed between the metal silicide and diamond by annealing the as-deposited metal silicide. The non-abrupt interface region may thus include silicon carbide, the carbide of the refractory metal, and mixtures thereof.

Despite the lesser expense and relative ease of fabricating polycrystalline diamond films as compared to single crystal diamond, attempts to obtain good rectifying characteristics on polycrystalline diamond have had little success. For example, Gildenblatt et al. in an article entitled *High Temperature Schottky Diodes with Boron-Doped Homoepitaxial Diamond Base*, Mat. Res. Bul., Vol. 25, pp. 129–134 (1990), report attempts to fabricate Schottky contacts using gold and aluminum on polycrystalline diamond, but indicate that such contacts have shown unacceptably high leakage current above 250°–300° C. Accordingly, Gildenblatt et al. teach a homoepitaxial diamond film formed on a single crystal diamond substrate to provide a rectifying contact with a gold electrode layer.

Surface roughness and grain boundaries provide reverse current leakage paths and degrade contact performance for polycrystalline diamond. Metals deposited onto polycrystalline diamond in an attempt to form a rectifying contact may diffuse into the diamond film through grain boundaries during subsequent high temperature processing or during operation, thereby degrading performance.

While polycrystalline diamond is a preferred material for many semiconductor devices, its surface roughness and grain boundaries have impeded the development of rectifying contacts on polycrystalline diamond. These disadvantages are further highlighted at higher temperatures where diffusion is more likely to occur. Accordingly, the advantages using polycrystalline diamond, such as lower cost and high operating temperatures, have not been realized.

SUMMARY OF THE INVENTION

It is therefore an object of the present invention to provide a rectifying contact and associated fabrication method therefor including polycrystalline diamond and operable at high temperatures. Polycrystalline diamond is readily fabricated and is less expensive than single crystal diamond; however, polycrystalline diamond has a rough surface and has grain boundaries unlike single crystal diamond.

This and other objects, advantages, and features of the invention are provided by a rectifying contact including a polycrystalline semiconducting diamond layer, and a refractory metal carbide layer on the polycrystalline diamond layer. The polycrystalline diamond layer and the refractory metal carbide layer define a substantially chemically non-reactive interface therebetween. Stated simply, this chemically non-reactive interface reduces outdiffusion of carbon atoms from the polycrystalline diamond layer to the refractory metal carbide layer, and thereby prevents degradation of the reverse leakage characteristics of the contact, especially after high temperature processing or during high temperature operation. Outdiffusion of carbon atoms causes electrically active defects in the outer face of the diamond thereby causing unacceptably high leakage.

The refractory metal is preferably selected from the group consisting of Group IV, V, and VI transition element metals, such as titanium, tantalum, tungsten, molybdenum, hafnium and niobium. The refractory metal carbide layer is thermally stable up to relatively high temperatures and is thus compatible with diamond for high temperature operation. The refractory metal carbide layer also has good mechanical adhesion to the underlying polycrystalline diamond layer.

A first embodiment of a rectifying contact according to the invention includes a single refractory metal carbide layer having substantially stoichiometric proportions of the refractory metal and carbon. Second and third embodiments of a rectifying contact according to the invention include two and three refractory metal carbide layers, respectively, wherein the different layers have different predetermined proportions of refractory metal and carbon. The refractory metal is preferably the same in the multiple layers.

The second embodiment of the rectifying contact includes a first refractory metal carbide layer on the polycrystalline diamond layer wherein the first layer has stoichiometric proportions of refractory metal and carbon. A second refractory metal carbide layer is on the first layer and the second layer has proportions of the refractory metal and carbon defining a metal-rich layer. The metal-rich layer facilitates electrical connection to the contact, while the first refractory metal carbide layer defines a substantially chemically non-reactive interface with the polycrystalline diamond. The first and second refractory metal carbide layers are also preferably graded into one another to thereby define a graded interface region therebetween.

The third embodiment of the rectifying contact includes three layers of refractory metal carbide on the polycrystalline diamond layer. A first refractory metal carbide layer is on the diamond layer and has proportions of refractory metal and carbon defining a carbon-rich layer. The carbon-rich layer reduces diffusion of carbon across the interface with the polycrystalline diamond layer. A second layer of refractory metal carbide is on the first layer and has substantially stoichiometric proportions of refractory metal and carbon. A third outermost layer of metal-rich refractory metal carbide is on the second layer and facilitates electrical connection to the contact.

The embodiments of the rectifying contact described above may be readily incorporated into other semiconductor devices and components. For example, a metal semiconductor field effect transistor (MESFET) may be provided according to the invention. The MESFET includes a polycrystalline diamond layer having a source region, a drain region, and a channel region. The refractory metal carbide layer, or multiple such layers, define a gate electrode overlying the channel region.

In each of the embodiments described above, the polycrystalline diamond layer is preferably doped with boron to form a p-type semiconducting layer. The polycrystalline diamond layer may also be readily formed on a nondiamond substrate, such as silicon. Accordingly, one method for making the rectifying contact includes the steps of providing a polycrystalline semiconducting diamond layer, and forming a refractory metal carbide layer on the diamond layer. The refractory metal carbide layer is preferably deposited using conventional semiconductor deposition techniques rather than formed in situ by a solid state reaction. The direct deposition prevents forming electrically active defects in the outer surface of the polycrystalline diamond layer at the interface with the refractory metal carbide layer as would occur in a solid state reaction.

The refractory metal carbide layer may be formed by sputtering, evaporation, chemical vapor deposition, and molecular beam epitaxy (MBE) as would be readily understood by those skilled in the art. The multiple layer embodiments may also be readily formed by controlling the proportions of refractory metal and carbon during deposition as would be readily appreciated by those skilled in the art. The interface regions between the refractory metal carbide layers are also preferably graded during deposition.

Alternately, a layer of polycrystalline diamond may be formed on a layer of refractory metal carbide. The refractory metal carbide layer may be formed on a nondiamond substrate. The refractory metal carbide is thermally stable above the temperature ranges typically used for diamond deposition, that is, 700°–800° C., and diamond will readily deposit on the refractory metal carbide. Accordingly, another method for making the rectifying contact includes forming a layer of refractory metal carbide and depositing a layer of polycrystalline diamond thereon. This method permits more freedom in device fabrication, such as to permit fabrication of buried gate electrode for an FET and vertical integration of devices.

DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements in alternate embodiments throughout. The thickness of layers and regions are exaggerated for clarity.

Figure 1:
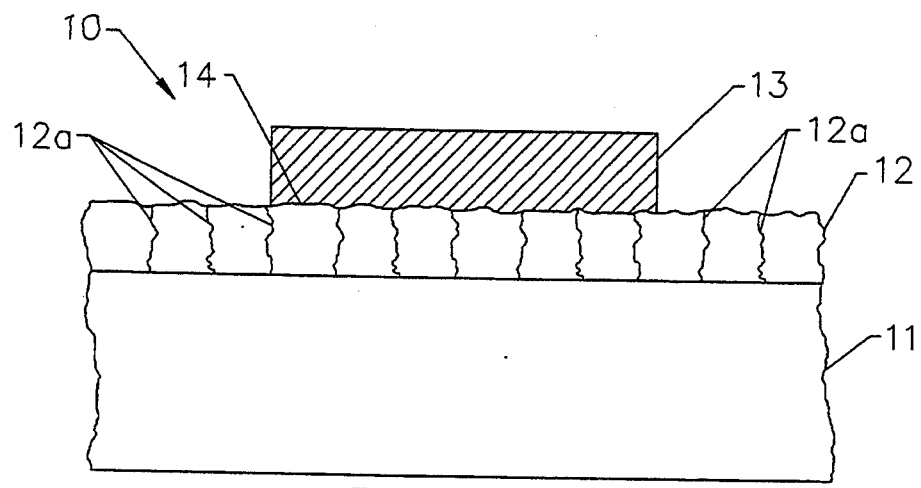
FIG. 1 is a cross-sectional side view of a first embodiment of a rectifying contact according to the invention.

Referring to FIG. 1, there is shown a first embodiment of a rectifying contact 10 according to the invention. As would be readily understood by those skilled in the art, the rectifying contact 10 may be used in a variety of semiconductor devices, such as diodes and FET's, for example.

The rectifying contact 10 includes a substrate 11, such as silicon, upon which a polycrystalline semiconducting diamond layer 12 is formed, for example by chemical vapor deposition, as would also be readily understood by those having skill in the art. Grain boundaries 12a in the polycrystalline diamond layer 12 are schematically illustrated along with the somewhat irregular or rough upper surface of the polycrystalline diamond layer at the interface 14 between the polycrystalline diamond layer 12 and the refractory metal carbide layer 13. The polycrystalline semiconducting diamond layer 12 is preferably p-type and doped to a concentration in the range of about $10^{16}$–$10^{19}$ cm$^{-3}$, such as with boron.

The polycrystalline diamond layer 12 and the refractory metal carbide layer 13 according to the invention define a chemically non-reactive interface 14 therebetween. This chemically non-reactive interface 14 reduces outdiffusion of carbon atoms from the polycrystalline diamond layer 12 to the refractory metal carbide layer 13. In other words, it is theorized by applicants without their wishing to be bound thereto, that a chemically active interface would produce an ohmic rather than rectifying contact. This is theorized since chemical reactions at the interface create electrically active defects at the surface of the diamond and modify the interface electronic structure, that is, the reactions decrease the depletion width and/or effective barrier height to thereby increase reverse leakage current. The contact 10 according to the present invention overcomes the drawbacks previously associated with forming a rectifying contact on polycrystalline diamond.

In the first embodiment of the rectifying contact 10, the proportions of the refractory metal and carbon in the refractory metal carbide layer 13 are substantially stoichiometric. By substantially stoichiometric is meant that for TiC$_x$, for example, x is in the range of about 0.8 to 1.2. The refractory metal is preferably selected from the group consisting of Group IV, V, and VI transition element metals, such as titanium, tantalum, tungsten, molybdenum, hafnium and niobium. The thickness of the refractory metal carbide layer 13 is also preferably greater than about 0.1 μm thick to provide coverage of the relatively rough polycrystalline diamond surface. Accordingly, the refractory metal carbide layer 13 preferably has a thickness in the range of about 0.1 to 0.5 μm.

Refractory metal carbides have a low diffusivity of carbon. Accordingly, carbon is not likely to diffuse across the interface 14 to degrade contact performance. In addition, the refractory metal carbides are stable at high operating temperatures and, moreover, provide stable rectifying operation with diamond at temperatures up to 850° C.

Figure 2:
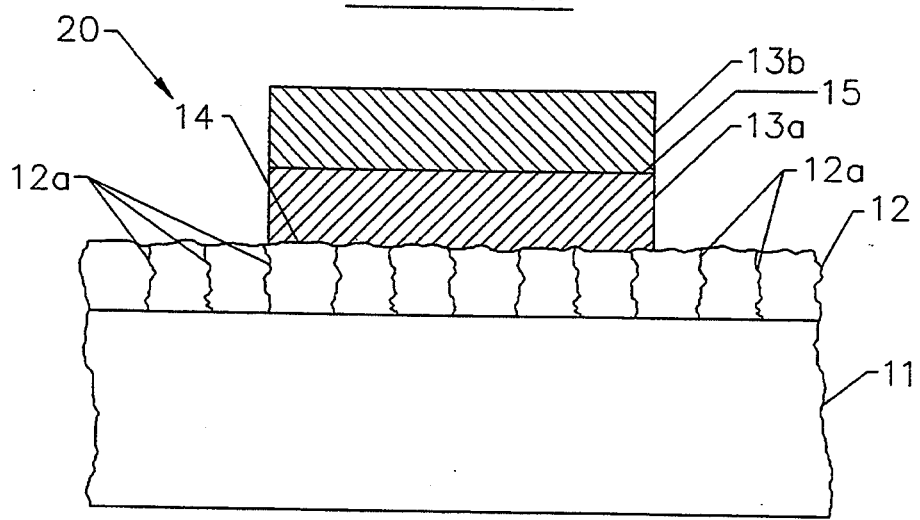
FIG. 2 is a cross-sectional side view of a second embodiment of a rectifying contact according to the invention.

A second embodiment of a rectifying contact 20 according to the invention is shown in FIG. 2. This embodiment includes a first refractory metal carbide layer 13a on the polycrystalline diamond layer 12, and a second refractory metal carbide layer 13b on the first layer. A substrate 11 supports the polycrystalline diamond layer 12.

The first refractory metal carbide layer 13a includes substantially stoichiometric proportions of the refractory metal and carbon, as described above with reference to the first embodiment of the rectifying contact be. The first refractory metal carbide layer 13a also forms a substantially chemically non-reactive interface 14 with the polycrystalline diamond layer 12.

The second refractory metal carbide layer 13b is a metal-rich layer wherein metal-rich means that for TiC$_x$, for example, x is less than about 0.8. The metal-rich layer second refractory metal carbide layer 13b provides a good surface for an electrical connection thereto.

The first and second refractory metal carbide layers 13a, 13b of the rectifying contact 20 are both preferably formed of the same refractory metal. In addition, while the interface 15 between the two layers 13a,13b is indicated schematically by a line in FIG. 2, the interface is preferably a graded region extending into portions of both layers as would be readily appreciated by those skilled in the art.

Figure 3:
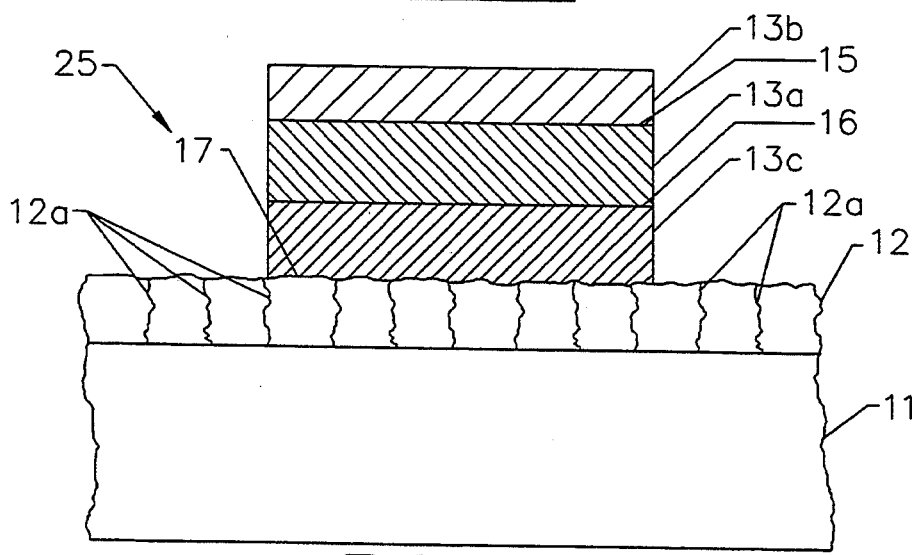
FIG. 3 is a cross-sectional side view of a third embodiment of a rectifying contact according to the invention.

A third embodiment of a rectifying contact 25 according to the present invention is illustrated in FIG. 3. This embodiment includes a substrate 11 and a polycrystalline diamond layer 12 thereon. Three refractory metal carbide layers 13c, 13a, and 13b are formed on the polycrystalline diamond layer 12. The first refractory metal layer 13c is a carbon-rich refractory metal layer wherein carbon-rich means that for TiC$_x$, for example, x is greater than 1.2. The carbon-rich refractory metal layer 13c prevents the diffusion of carbon across the interface 17 with the polycrystalline diamond layer 12.

The second refractory metal carbide layer 13a of the rectifying contact 25 is a substantially stoichiometric layer as described above with respect to the second embodiment shown in FIG. 2. The third refractory metal carbide layer 13b is a metal-rich refractory metal carbide layer also as described above with respect to the second embodiment shown in FIG. 2.

The interface 15 between the second and third refractory metal carbide layers 13a, 13b, respectively, is preferably a graded region, as described above with respect to the second embodiment of the invention. The interface 16 between the first and second refractory metal carbide layers 13c, 13a, respectively, is also preferably a graded region rather than an abrupt interface.

Figure 4:
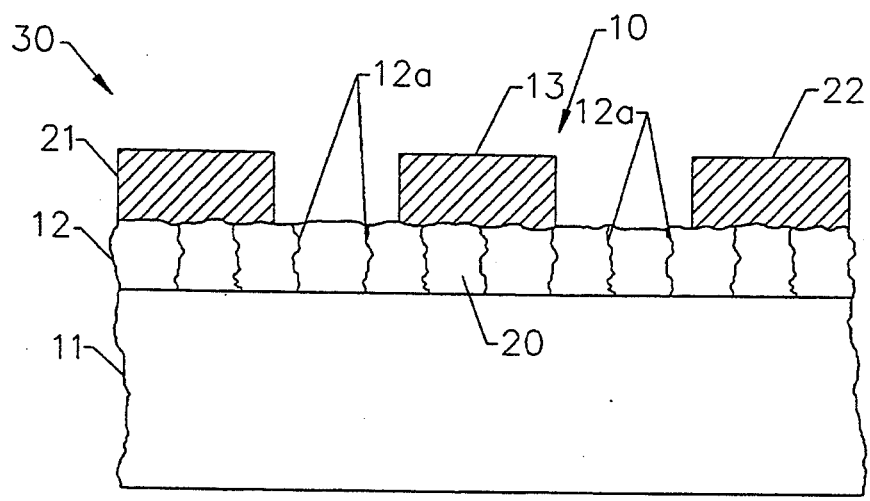
FIG. 4 is a cross-sectional side view of a metal semiconductor field effect transistor (MESFET) according to the invention incorporating the rectifying contact as shown in FIG. 1.

Referring now to FIG. 4, a metal semiconductor field effect transistor (MESFET) 30 according to the invention is illustrated incorporating a rectifying contact 10 as shown in FIG. 1. The rectifying contact 10 includes a refractory metal carbide layer 13 on polycrystalline diamond layer the polycrystalline diamond layer 12 being formed on a supporting substrate 11. The refractory metal carbide layer 13 may be a single substantially stoichiometric layer as illustrated in FIG. 1, or the multilayer refractory metal structures as illustrated in FIGS. 2 and 3 may also be used for the rectifying contact of the MESFET 30.

In the illustrated embodiment, the MESFET 30 includes spaced apart source and drain ohmic contacts 21, 22, respectively, provided on the polycrystalline diamond layer 12. The ohmic contacts 21 and 22 may be provided by a refractory metal deposited onto the polycrystalline diamond, especially wherein the adjacent respective surfaces of the polycrystalline diamond are highly doped. The refractory metal carbide layer 13 on the polycrystalline diamond layer 12 provides the gate for the MESFET overlying the active channel region 20 in the polycrystalline diamond layer. As would be readily understood by those skilled in the art, a vertical MESFET structure is also contemplated by the present invention.

Figure 5:
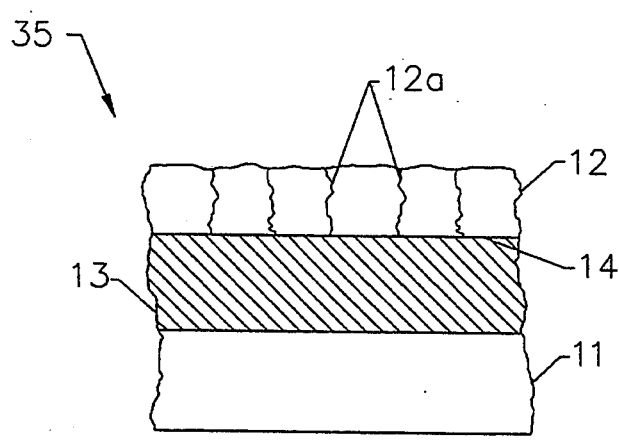
FIG. 5 is a cross-sectional side view of a fourth embodiment of a rectifying contact according to the invention.

Another aspect of the present invention is illustrated by the embodiment of the rectifying contact 35 shown in FIG. 5. Considering the low diffusivity of carbon in refractory metal carbides, particularly titanium carbide, the refractory metal layer 13 may also serve as a good material on which to nucleate and grow the polycrystalline diamond layer 12. The refractory metal carbide layer 13 may be formed on a nondiamond substrate 11. For some applications, the nondiamond substrate may be later removed from the device. Diamond may be readily deposited on the refractory metal carbide layer 13, such as by chemical vapor deposition techniques in the temperature range of 700°–800° C. The refractory metal carbide is also thermally stable up to 850° C. By depositing the diamond layer on the refractory metal carbide, more freedom in terms of device structure is available, such as, for example, permitting buried gate electrodes for an FET and the vertical integration of devices.

Referring again to FIG. 1, a method for making a rectifying contact 10 according to the invention is explained. The method includes the steps of providing a polycrystalline diamond layer 12, and forming a refractory metal carbide layer 13 on the polycrystalline diamond layer to define a chemically non-reactive interface with the polycrystalline diamond layer. The preferred technique for forming the refractory metal carbide layer is by direct deposition of the refractory metal carbide onto the polycrystalline diamond. This direct deposition is contrasted with a solid state reaction of a refractory metal on diamond to form the refractory metal carbide. The solid state reaction is likely to produce electrically active defects in the surface of the diamond and degrade the rectifying characteristics. The refractory metal carbide layer 13 may be formed by sputtering, evaporation, chemical vapor deposition, or molecular beam epitaxy (MBE).

As shown in FIGS. 2 and 3, and described above with respect to the second and third embodiments of the rectifying contact 20, 25, respectively, multiple refractory metal layers 13a, 13b and 13c may be provided on the polycrystalline diamond layer 12. The multiple refractory metal layers may be readily formed using conventional techniques to produce a desired metal-rich, carbon-rich, and/or substantially stoichiometric layer(s) 13b, 13a and 13c, respectively. The multiple layers may be considered as representing predetermined portions of a refractory metal carbide layer having different predetermined proportions of refractory metal and carbon.

The polycrystalline diamond layer is preferably formed on a nondiamond substrate, such as silicon. However, as shown in FIG. 5 and described above with respect to the fourth embodiment of the rectifying contact 40, an alternative method includes forming the polycrystalline diamond 12 on a layer of refractory metal carbide 13. The refractory metal carbide layer 13 is preferably formed on a nondiamond substrate 11.

The following Example is illustrative of the present invention without being limiting thereof.

EXAMPLE

Boron-doped semiconducting polycrystalline diamond thin films were grown on silicon substrates using microwave plasma chemical vapor deposition (MPCVD). The atomic boron concentration in the films was approximately $3 \times 10^{18}$ cm$^{-3}$ as determined by secondary ion mass spectroscope (SIMS). The polycrystalline diamond samples were chemically cleaned in a mixture of $3H_2SO_4$:$4HNO_3$:$1HClO_4$ to remove any surface graphite or hydrocarbon contamination, followed by a rinse with deionized $H_2O$ and drying with $N_2$.

The samples were subsequently patterned with photoresist using standard photolithographic procedures. Titanium carbide layers of about 1000 Å thickness were deposited from a precleaned target using rf-sputtering at a rate of 50 Å/min. in a 20 mTorr argon atmosphere. The deposition rate was determined by measuring the thicknesses of several test depositions using a profilometer. The samples were maintained at room temperature during the deposition.

After the deposition, regions of the titanium carbide layer were lifted off to obtain a pattern of 100 μm diameter active contacts separated from a field region by a 100 μm wide concentric ring. Current-voltage (I-V) measurements were obtained between the active contacts and the field region using a HP4145B semiconductor parameter analyzer.

Post deposition anneals at 850° C. for 30 minutes were conducted in a vacuum of approximately $10^{-8}$ Torr. The sample temperature was measured using a disappearing filament optical pyrometer (Leeds & Northrup Co.) focused on the sample surface through a quartz window.

Figure 6:
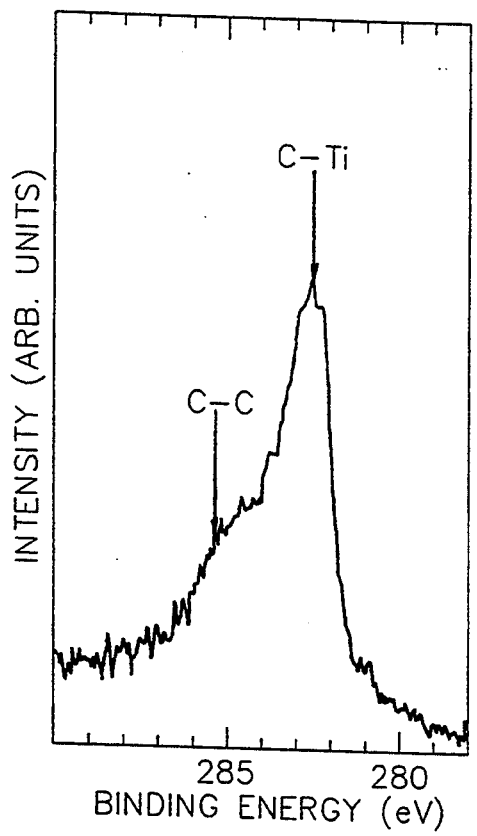
FIG. 6 is an X-Ray Photoelectron Spectroscopy (XPS) spectal plot of a titanium carbide contact as described in the Example.
Figure 7:
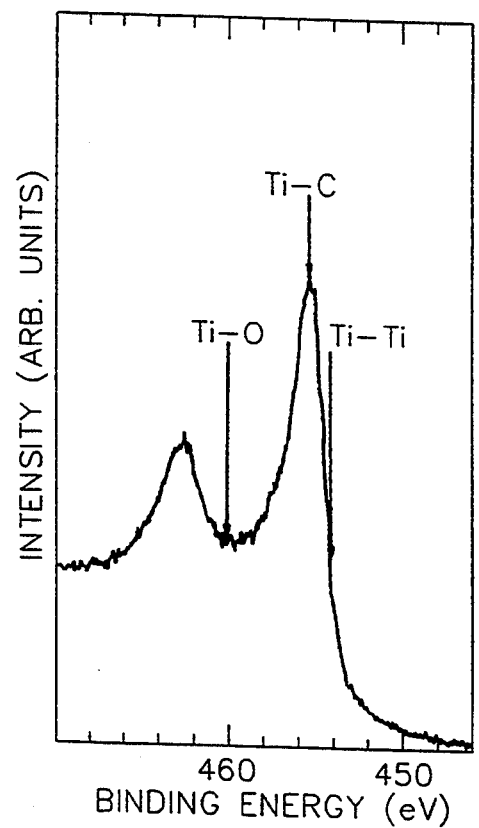
FIG. 7 is an X-ray Photoelectron Spectroscopy (XPS) spectal plot of a titanium carbide contact as described in the Example.

Using x-ray photoelectron spectroscopy (XPS), it was confirmed that the sputter-deposited film was titanium carbide as shown in FIGS. 6 and 7. Approximately 30% of the total carbon was observed to be bonded as C—C rather than C-Ti. However, neither elemental titanium or titanium dioxide ($TiO_2$) was observed as shown in FIG. 7. Applicants theorize, without wishing to be bound thereto, that it is important not to include elemental titanium in the contact layer adjacent the polycrystalline diamond as discussed below.

Figure 8:
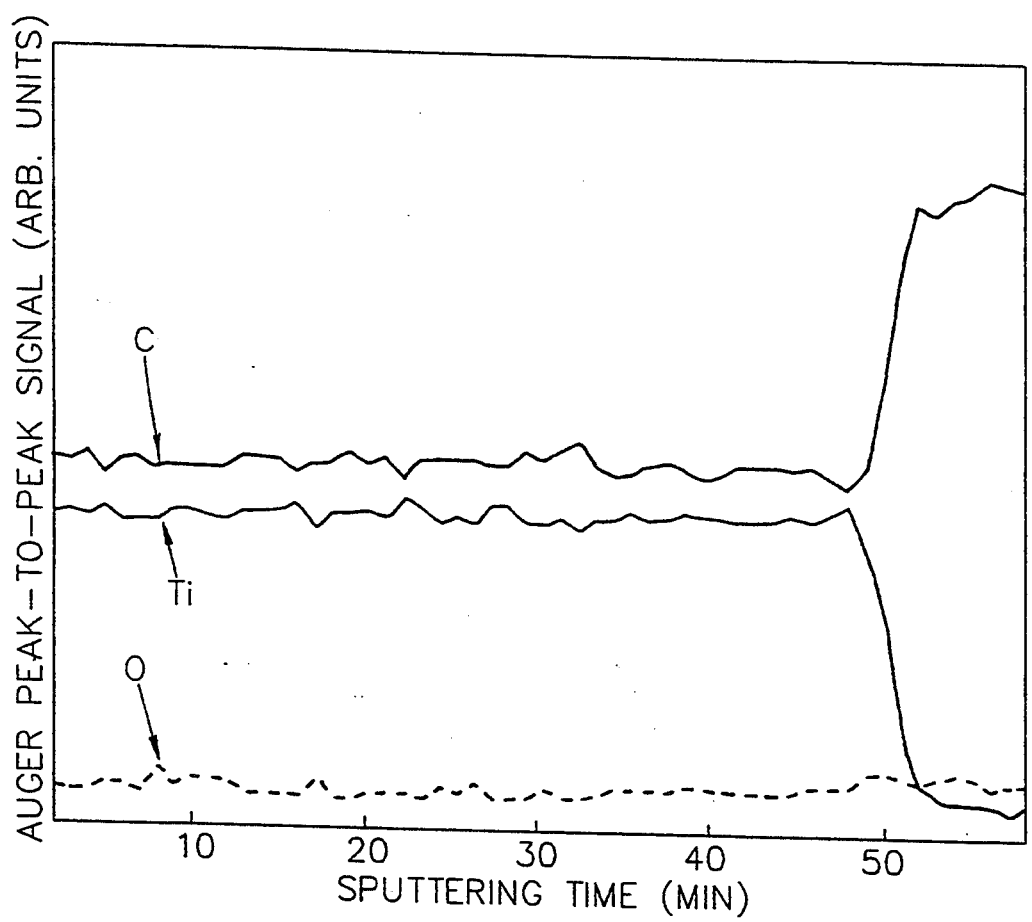
FIG. 8 is an Auger depth profile plot of a titanium carbidescontact layer as described in the Example.

The stoichiometry of the titanium carbide film was $TIC_{0.88}$ as determined by comparison with a standard titanium carbide single crystal whose composition was measured using Rutherford backscattering channeling. This substoichiometric composition is typical of titanium carbide due to the stability of carbon vacancies. It was also confirmed by Auger Electron Spectroscopy combined with argon+-ion beam etching that the surface composition observed in the XPS analysis was the same as that of the bulk (below surface) of the film as shown in FIG. 8.

Figure 9:
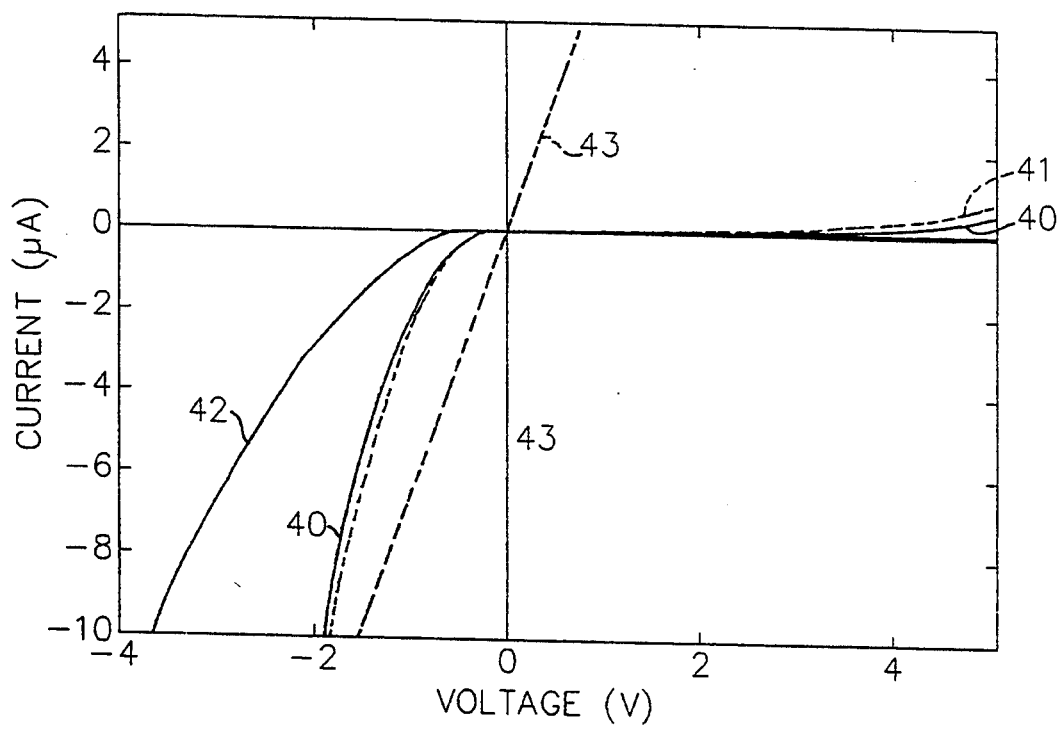
FIG. 9 is a plot of current versus voltage (I-V) characteristics for different contact materials as described in the Example.

The rectifying I-V characteristics of the titanium carbide contacts measured at room temperature are shown by the plot 40 in FIG. 9. The as-deposited titanium carbide formed rectifying contacts with a reverse leakage current of 0.4 μA at 5 V. After an anneal at 850° C., the reverse leakage current increased to 0.7 μA, but the rectifying nature of the contacts was not significantly affected as shown in plot 41.

Also shown in FIG. 9 for comparison are I-V characteristics of titanium contacts on a B-doped diamond film (plot 42) grown in the identical conditions. The titanium contacts were also rectifying initially. However, their I-V characteristics became linear, that is, ohmic and no longer rectifying, following a heat treatment at 430° C. in the same UHV environment as shown in plot 43.

Applicants theorize without wishing to be bound thereto, that at least two factors are contributing to the formation of the titanium carbide rectifying contacts. First, the small work function of titanium carbide (2.6–2.7 eV) is favorable for the formation of a Schottky barrier on p-type semiconducting diamond. Furthermore, and perhaps more importantly, especially for retaining the rectifying nature after high temperature processes, the non-reactive nature of the titanium carbide (+C) contacts, as well as the very slow self-diffusion of carbon and titanium in titanium carbide contribute to preserving the as-deposited interface between the titanium carbide and polycrystalline diamond.

The diffusion constant of Carbon in $TIC_{0.88}$ at 850° C. is estimated to be in the range of $10^{-19}-10^{-17}$ cm$^2$/sec. This range of values at 850° C. was calculated using the pre-exponential constant ($D_0$) and activation energy (Q) of C-diffusion in $TIC_{0.88}$ reported for a temperature range between 1450°–2280° C. The corresponding value of C-diffusion in a titanium matrix is $10^{-8}-10^{-7}$ cm$^2$/sec. These diffusion data indicate that, at the Ti-diamond interface, carbon atoms undesirably diffuse into the titanium relatively easily to form titanium carbide which is a thermodynamically favorable reaction (the free energy of formation for titanium carbide is 42 kcal/mol at 430° C.), while carbon atoms are much less likely to leave the polycrystalline diamond and diffuse into the titanium carbide layer which is free of elemental titanium as seen in FIG. 7.

Creation of electrically active defects via this outdiffusion accompanying the carburization of titanium contacts leads to the formation of "ohmic" or more precisely, very leaky contacts. Thus, it is important to have a chemically non-reactive interface to minimize outdiffusion so as not to create defects near the diamond surface via a solid state reaction. The chemically non-reactive interface provides a rectifying contact on polycrystalline diamond that retains rectifying characteristics at high temperatures. Further, the refractory nature of the titanium carbide makes both itself and the interface with the polycrystalline diamond non-reactive, therefore, the titanium carbide contacts retained their rectifying characteristics at high temperatures.

This model, which is based on the diffusion of carbon from diamond into the titanium contact layer and the creation of electrically active defects, is supported by other experimental observations. The ohmic contacts of carbide-forming transition metals such as titanium and molybdenum formed on diamond surfaces via solid state reaction reached optimums in terms of contact resistivity after certain periods of annealing, and subsequently degraded for further heat treatments. A similar result has been previously obtained for titanium contact pads formed on the B-doped polycrystalline diamond.

The contact resistivity, which was measured using the transfer length method (TLM), increased with annealing time after it was optimized at 3 hours. It is believed that the defects created by the diffusion of carbon into the carbide-forming metals reached their maximum density after 3 hours of annealing and subsequently diffused out. Diffusion of carbon from diamond into the titanium overlayer has been also observed by heating the sample in-situ in a transmission electronic microscope (TEM).

The embodiments of rectifying contacts 10, 20, 25, and 35 described above may advantageously be used in a variety of semiconductor devices, such as diodes or incorporated into FET's like the MESFET 30 as described above. One skilled in the art would readily appreciate other semiconductor devices incorporating the rectifying contacts according to the invention. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A semiconductor device comprising:
   a doped polycrystalline semiconducting diamond layer; and
   a refractory metal carbide layer on said polycrystalline semiconducting diamond layer and forming a rectifying contact therewith, said refractory metal carbide layer and said polycrystalline semiconducting diamond layer defining a substantially chemically nonreactive interface therebetween for reducing outdiffusion of carbon atoms from said polycrystalline semiconducting diamond layer to said refractory metal carbide layer to thereby reduce electrically active defects in said polycrystalline semiconducting diamond layer, said refractory metal carbide layer having a plurality of portions of different predetermined proportions of refractory metal and carbon.

2. A semiconductor device according to claim 1, wherein one of said plurality of portions of said refractory metal carbide layer having substantially stoichiometric proportions of refractory metal and carbon so that a ratio of carbon to refractory metal is in a range of about 0.8 to 1.2.

3. A semiconductor device according to claim 1 wherein a refractory metal of said refractory metal carbide layer is selected from the group consisting of Group IV, V, and VI transition element metals.

4. A semiconductor device according to claim 1 wherein a refractory metal of said refractory metal carbide layer is selected from the group consisting of titanium, tantalum, tungsten, molybdenum, hafnium and niobium.

5. A semiconductor device according to claim 1 wherein said semiconductor device is a metal semiconductor field effect transistor; wherein said polycrystalline diamond layer includes a source region, a drain region, and a channel region; and wherein said refractory metal carbide layer defines a gate electrode overlying said channel region.

6. A semiconductor device according to claim 1 wherein said polycrystalline semiconducting diamond layer is p-type.

7. A semiconductor device according to claim 1 further comprising a nondiamond substrate on said polycrystalline diamond layer opposite said refractory metal carbide layer.

8. A semiconductor device comprising:
a polycrystalline semiconducting diamond layer;
a first refractory metal carbide layer on said polycrystalline diamond layer, said first refractory metal carbide layer having substantially stoichiometric proportions of refractory metal and carbon so that a ratio of carbon to refractory metal is in a range of about 0.8 to 1.2; and
a second refractory metal carbide layer on said first refractory metal carbide layer, said second refractory metal carbide layer having proportions of refractory metal and carbon so that a ratio of carbon to refractory metal is less than about 0.8 defining a metal-rich layer;
whereby said polycrystalline diamond layer and said first and second refractory carbide metal layers form a rectifying contact.

9. A semiconductor device according to claim 8 wherein said polycrystalline diamond layer and said first refractory metal carbide layer define a chemically non-reactive interface therebetween for reducing out-diffusion of carbon atoms from said polycrystalline diamond layer to said first refractory metal carbide layer.

10. A semiconductor device according to claim 8 wherein said first and second refractory metal carbide layers define a graded interface region therebetween.

11. A semiconductor device according to claim 8 wherein said first and second refractory metal carbide layers include a same refractory metal.

12. A semiconductor device according to claim 11 wherein said refractory metal is selected from the group consisting of Group IV, V, and VI transition element metals.

13. A semiconductor device according to claim 11 wherein said refractory metal is selected from the group consisting of titanium, tantalum, tungsten, molybdenum, hafnium and niobium.

14. A semiconductor device according to claim 8 wherein said semiconductor device is a metal semiconductor field effect transistor; wherein said polycrystalline diamond layer includes a source region, a drain region, and a channel region; and wherein said first and second refractory metal carbide layers define a gate electrode overlying said channel region.

15. A semiconductor device according to claim 8 wherein said polycrystalline semiconducting diamond layer is p-type.

16. A semiconductor device according to claim 8 further comprising a nondiamond substrate on said polycrystalline diamond layer opposite said first refractory metal carbide layer.

17. A semiconductor device comprising:
a polycrystalline semiconducting diamond layer;
a first refractory metal carbide layer on said diamond layer, said first refractory metal carbide layer having proportions of refractory metal and carbon so that a ratio of carbon to refractory metal is greater than about 1.2 defining a carbon-rich layer;
a second refractory metal carbide layer on said first refractory metal carbide layer, said second refractory metal carbide layer having substantially stoichiometric proportions of refractory metal and carbon so that a ratio of carbon to refractory metal is in a range of about 0.8 to 1.2; and
a third refractory metal carbide layer on said second refractory metal carbide layer, said third refractory metal carbide layer having proportions of refractory metal and carbon so that a ratio of carbon to refractory metal is less than about 0.8 defining a metal-rich layer;
whereby said polycrystalline diamond layer and said first, second, and third refractory metal carbide layers form a rectifying contact.

18. A semiconductor device according to claim 17 wherein said polycrystalline diamond layer and said first refractory metal carbide layer define a chemically non-reactive interface therebetween for reducing out-diffusion of carbon atoms from said polycrystalline diamond layer to said first refractory metal carbide layer.

19. A semiconductor device according to claim 17 wherein said first and second refractory metal carbide layers define a first graded interface region therebetween.

20. A semiconductor device according to claim 19 wherein said second and third refractory metal carbide layers define a second graded interface region therebetween.

21. A semiconductor device according to claim 17 wherein said first, second, and third refractory metal carbide layers include a same refractory metal.

22. A semiconductor device according to claim 21 wherein said refractory metal is selected from the group consisting of Group IV, V, and VI transition element metals.

23. A semiconductor device according to claim 21 wherein said refractory metal is selected from the group consisting of titanium, tantalum, tungsten, molybdenum, hafnium and niobium.

24. A semiconductor device according to claim 17 wherein said semiconductor device is a metal semiconductor field effect transistor; wherein said polycrystalline diamond layer includes a source region, a drain region, and a channel region; and wherein said first, second and third refractory metal carbide layers define a gate electrode overlying said channel region.

25. A semiconductor device according to claim 17 wherein said polycrystalline semiconducting diamond layer is p-type.

26. A semiconductor device according to claim 17 further comprising a nondiamond substrate on said polycrystalline diamond layer opposite said first refractory metal carbide layer.

* * * * *